(12) United States Patent  (10) Patent No.: US 7,508,210 B2
Morich et al.  (45) Date of Patent: Mar. 24, 2009

(54) SHORT ELEMENT TEM COIL FOR ULTRA-HIGH FIELD MR

(75) Inventors: Michael A. Morich, Mentor, OH (US); Gordon D. Demeester, Wickliffe, OH (US); Zhiyong Zhai, Mayfield Heights, OH (US); Paul R. Harvey, Best (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 64 days.

(21) Appl. No.: 11/569,074

(22) PCT Filed: May 11, 2005

(86) PCT No.: PCT/IB2005/051554

§ 371 (c)(1),
(2), (4) Date: Nov. 14, 2006

(87) PCT Pub. No.: WO2005/111646

PCT Pub. Date: Nov. 24, 2005

(65) Prior Publication Data

US 2007/0182414 A1   Aug. 9, 2007

Related U.S. Application Data

(60) Provisional application No. 60/640,366, filed on Dec. 30, 2004, provisional application No. 60/571,099, filed on May 14, 2004.

(51) Int. Cl.
*G01V 3/00* (2006.01)
(52) U.S. Cl. ............................. 324/318; 324/322
(58) Field of Classification Search ............ 324/318, 324/322
See application file for complete search history.

(56) References Cited

U.S. PATENT DOCUMENTS

| 4,751,464 | A | * | 6/1988 | Bridges ................ 324/318 |
| 5,179,332 | A | | 1/1993 | Kang |
| 5,557,247 | A | | 9/1996 | Vaughn, Jr. |
| 5,689,188 | A | * | 11/1997 | Claasen-Vujcic ....... 324/318 |
| 5,886,596 | A | | 3/1999 | Vaughan, Jr. |
| 7,215,120 | B2 | * | 5/2007 | Vaughan .............. 324/318 |
| 7,239,139 | B2 | * | 7/2007 | Findeklee ............ 324/318 |
| 2002/0050818 | A1 | | 5/2002 | Vaughn et al. |
| 2002/0153893 | A1 | | 10/2002 | Watkins et al. |
| 2002/0190717 | A1 | | 12/2002 | Leussler et al. |
| 2004/0100261 | A1 | | 5/2004 | Laskaris et al. |
| 2004/0100346 | A1 | | 5/2004 | Jevtic et al. |

FOREIGN PATENT DOCUMENTS

| DE | 43 31 021 A1 | 3/1995 |
| WO | WO 02/095435 A1 | 11/2002 |
| WO | WO 2004/048989 A1 | 6/2004 |

OTHER PUBLICATIONS

Alecci, M, et al.; Characterisation and Reduction of Eddy Currents in a TEM Resonator, 2001; Proc. Intl. Soc. Mag. Reson. Med.; 9:1134.

(Continued)

*Primary Examiner*—Brij B. Shrivastav
*Assistant Examiner*—Megann E Vaughn

(57) ABSTRACT

A transverse electromagnetic (TEM) coil is provided. The TEM coil includes an electrically conductive shell and an end plate disposed at a first end of the shell. The TEM coil also includes a plurality of TEM elements disposed within the shell, the plurality of TEM elements being shorter than the shell.

20 Claims, 8 Drawing Sheets

OTHER PUBLICATIONS

Baertlein, B.A., et al.; Theoretical Model for an MRI Radio Frequency Resonator; 2000; IEEE Transactions on Biomedical Engineering; 47(4)535-546.

Bogdanov, G., et al.; Coupled Microstrip Line Transverse Electromagnetic Resonator Model for High-Field Magnetic Resonance Imaging; 2002; MRM; 47:579-593.

Durr, W., et al.; A Dual-Frequency Circularly Polarizing Whole-Body MR Antenna for 69/170 MHz; 1991; MRM; 19(2) 446-454.

Ibrahim, T.S., et al.; Analysis of B1 field profiles and SAR values for multi-strut transverse electromagnetic RF coils in high field MRI applications; 2001; Phys. Med. Biol.; 46:2545-2555.

Vaughan, J.T., et al.; A Body Coil for High Field MR; 2002; Proc. Intl. Soc. Mag. Reson. Med.; 10.

Vaughan, J.T., et al.; 7T vs. 4T: RF Power, Homogeneity, and Signal-to-Noise Comparison in Head Images; 2001; MRM; 46:24-30.

* cited by examiner

SHORT ELEMENT TEM COIL FOR ULTRA-HIGH FIELD MR

CROSS REFERENCE TO RELATED APPLICATIONS

This application claims the benefit of U.S. provisional application Ser. No. 60/571,099 filed May 14, 2004 and U.S. Provisional application Ser. No. 60/640,366 filed Dec. 30, 2004, both of which are incorporated herein by reference.

The following relates to the magnetic resonance arts. It finds particular application in magnetic resonance imaging at ultra-high magnetic fields at 3 tesla and above, and will be described with particular reference thereto. However, it also finds application in magnetic resonance imaging generally, as well as in magnetic resonance spectroscopy and related magnetic resonance techniques.

In most MR systems, the combination of a transmit volume coil and local receive coils is often desired in order to obtain good image signal-to-noise ratio (SNR). Currently there are transverse electromagnetic (TEM) and birdcage transmit/receive head coils for 7T systems. These head coils have relatively small size in order to have high receive sensitivity and limited SAR. They are intended to be used as both transmit and receive coils and have limited internal space to allow use together with other local receive coils, fMRI or noise protection devices. The transverse electromagnetic (TEM) resonator design as an RF coil has received heightened attention as a superior replacement of the standard birdcage coil in ultra high field 4.7-9.4 T MRI applications. It has been demonstrated that the corresponding operating frequencies of 200 and 400 MHz, the TEM resonator can achieve better field homogeneity and a higher quality factor than an equivalent birdcage coil, resulting in improved image quality.

Further to birdcage coils, the RF shield greatly decreases the $B_1$-field uniformity of the birdcage coil along it's axial-direction. For TEM coils, the RF "shield" is part of the coil itself and is not a real RF shield. Thus its $B_1$-field behaves like an unshielded birdcage and is more uniform than a shielded birdcage coil. However, TEM coils tend to have larger SAR than birdcage coils. Carefully choosing TEM coil length can balance between the advantage of a more uniform $B_1$-field and the disadvantage of larger SAR.

TEM coils described in the literature include radiating elements comparable in length to the RF "screen" return path. Usually they are close fitting to the object to maintain good filling factor (for S/N) and size appropriate for use with an insert gradient coil.

For some imaging techniques, such as sensitivity encoding (SENSE) applications, the use of a relatively large transmit head coil together with local receive coils is desirable. However, making current head coils large enough to accommodate the local receive coils can result in SAR problems.

The present invention contemplates improved apparatuses and methods that overcomes the aforementioned limitations and others.

In accordance with one embodiment of the invention, a transverse electromagnetic (TEM) coil is provided. The TEM coil includes an electrically conducting shell, an end plate disposed at a first end of the cylindrical shell, and a plurality of TEM elements disposed within the cylindrical shell, the plurality of TEM elements being shorter than the shell.

In accordance with another embodiment of the invention, a magnet resonance apparatus is provided. The magnetic resonance apparatus includes a main magnet for generating a main magnetic field in an examination region; a plurality of gradient coils for generating magnetic gradient fields in conjunction with the main magnetic field; and a RF transmit coil for transmitting RF pulses into the examination region, the transmit coil including a closed-end TEM coil and a plurality of TEM resonator elements having lengths substantially shorter than an overall length of the TEM coil.

One advantage of an embodiment of the invention is that increased space within the coil is facilitated.

Another advantage of an embodiment of the invention is that lower SAR is facilitated.

Another advantage of an embodiment of the invention is that extended axial coverage is facilitated.

Another advantage of an embodiment of the invention is that B1-field uniformity is facilitated.

Another advantage of an embodiment of the invention is that radiation loss is reduced.

Another advantage of an embodiment of the invention is that patient comfort is facilitated.

Another advantage of an embodiment of the invention is that less loading is facilitated.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance imaging system including a TEM radio frequency coil.

FIG. 2A diagrammatically shows a cross-section of a TEM coil.

Figure 4A:
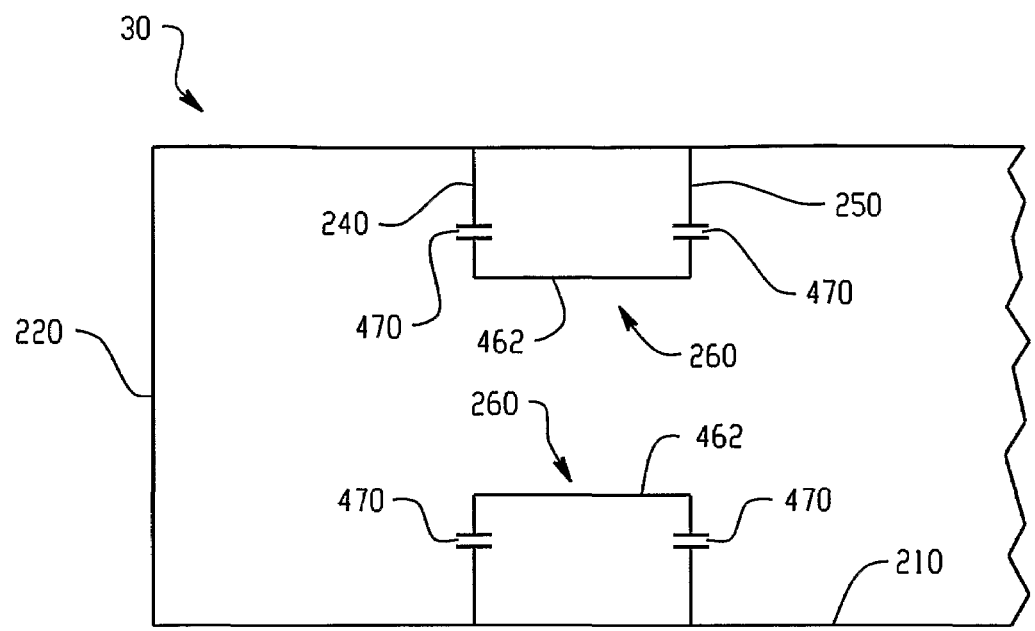

FIG. 4A diagrammatically shows a cross-section of another embodiment of a TEM coil.

Figure 4B:
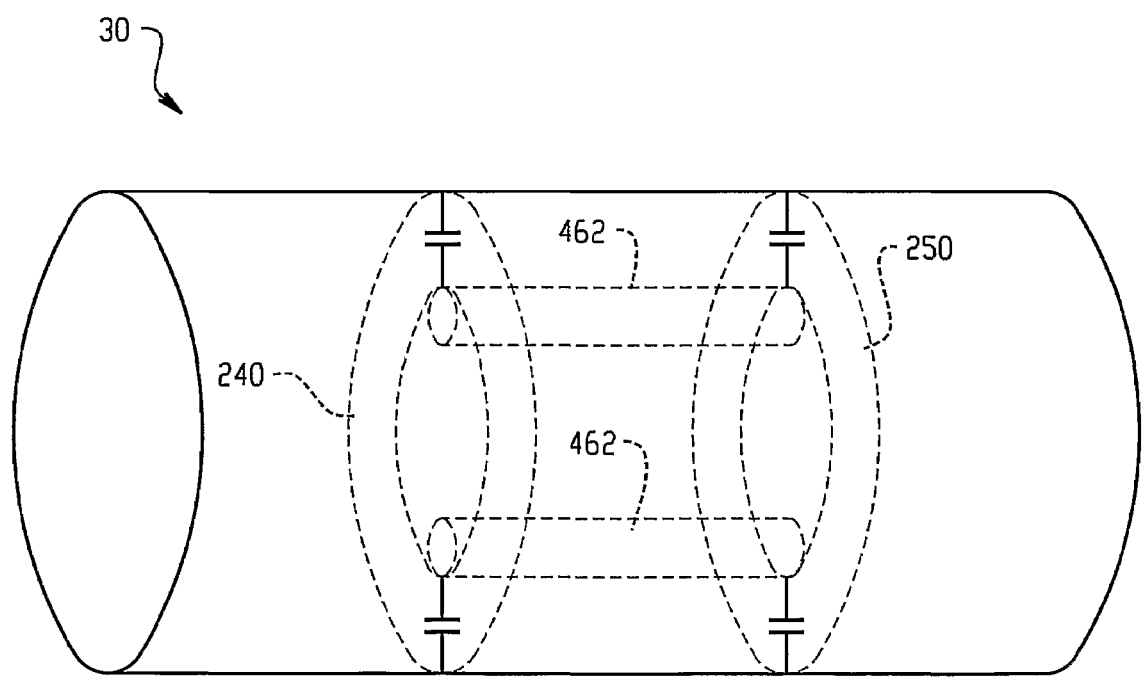

FIG. 4B shows a perspective view of another embodiment of a TEM coil.

Figure 5:
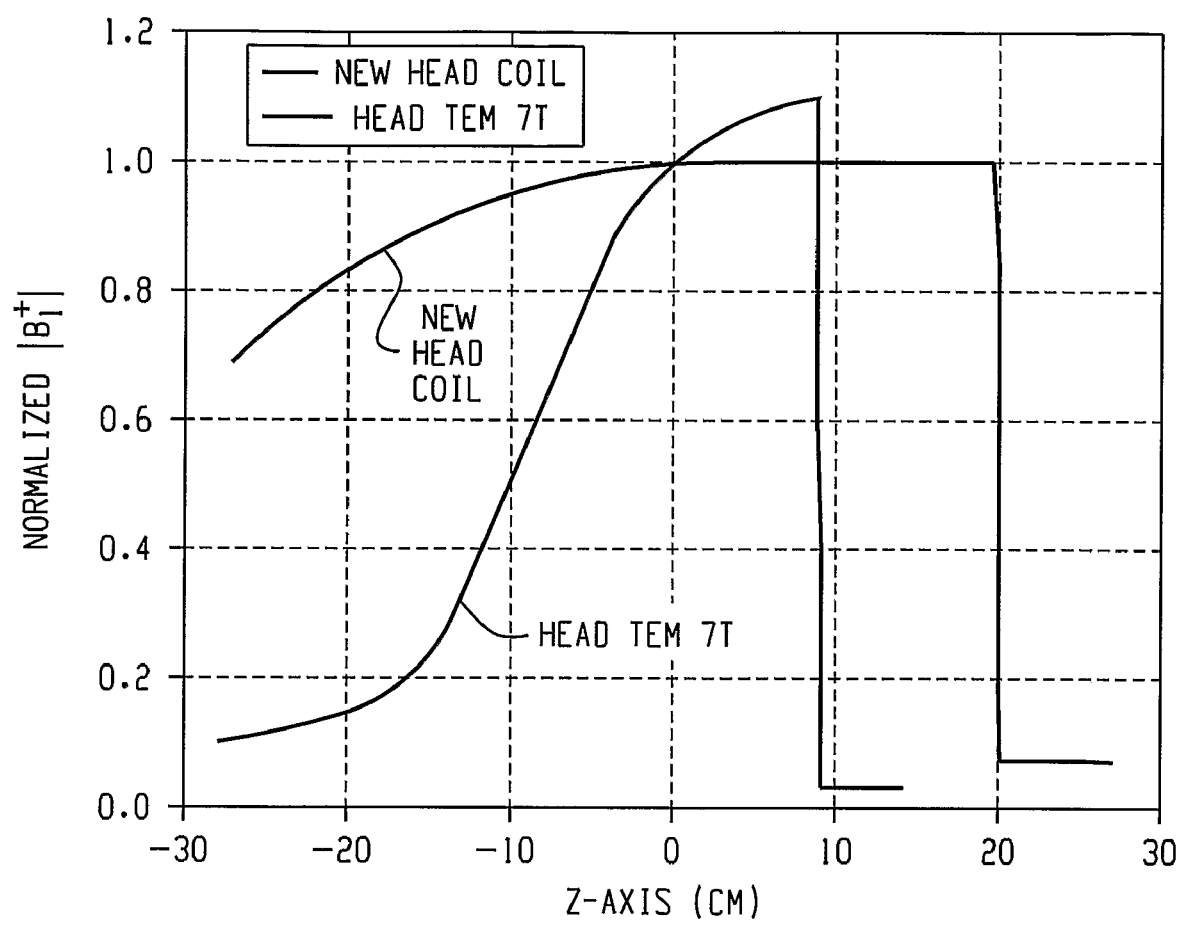

FIG. 5 shows a B1 field plot for two TEM coils.

Figure 6A:
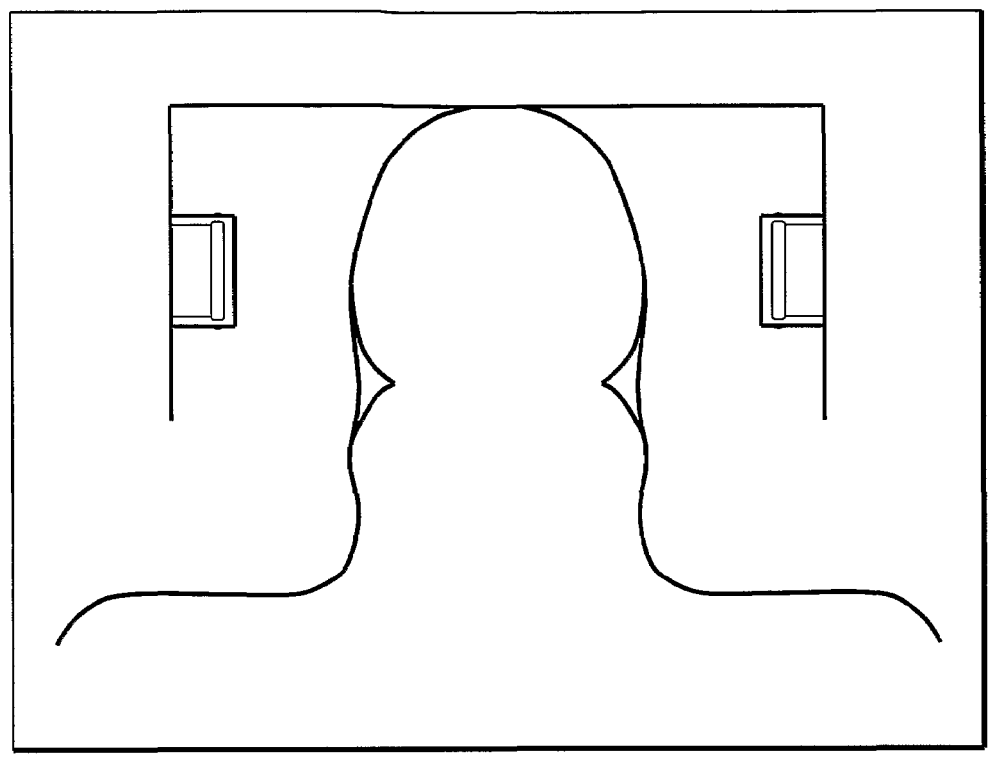

FIG. 6A diagrammatically shows an embodiment of a TEM coil in which TEM resonators are disposed in a central region of the coil.

Figure 6B:
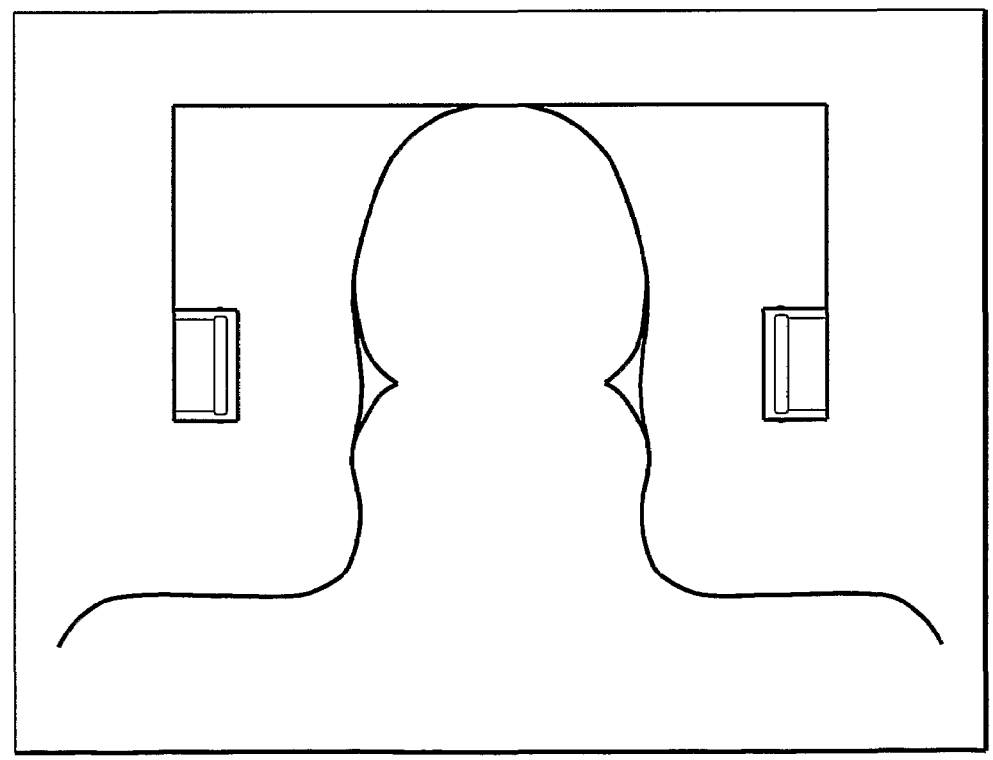

FIG. 6B shows an embodiment of a TEM coil where TEM resonators are disposed at an open end of the coil.

Figure 7:
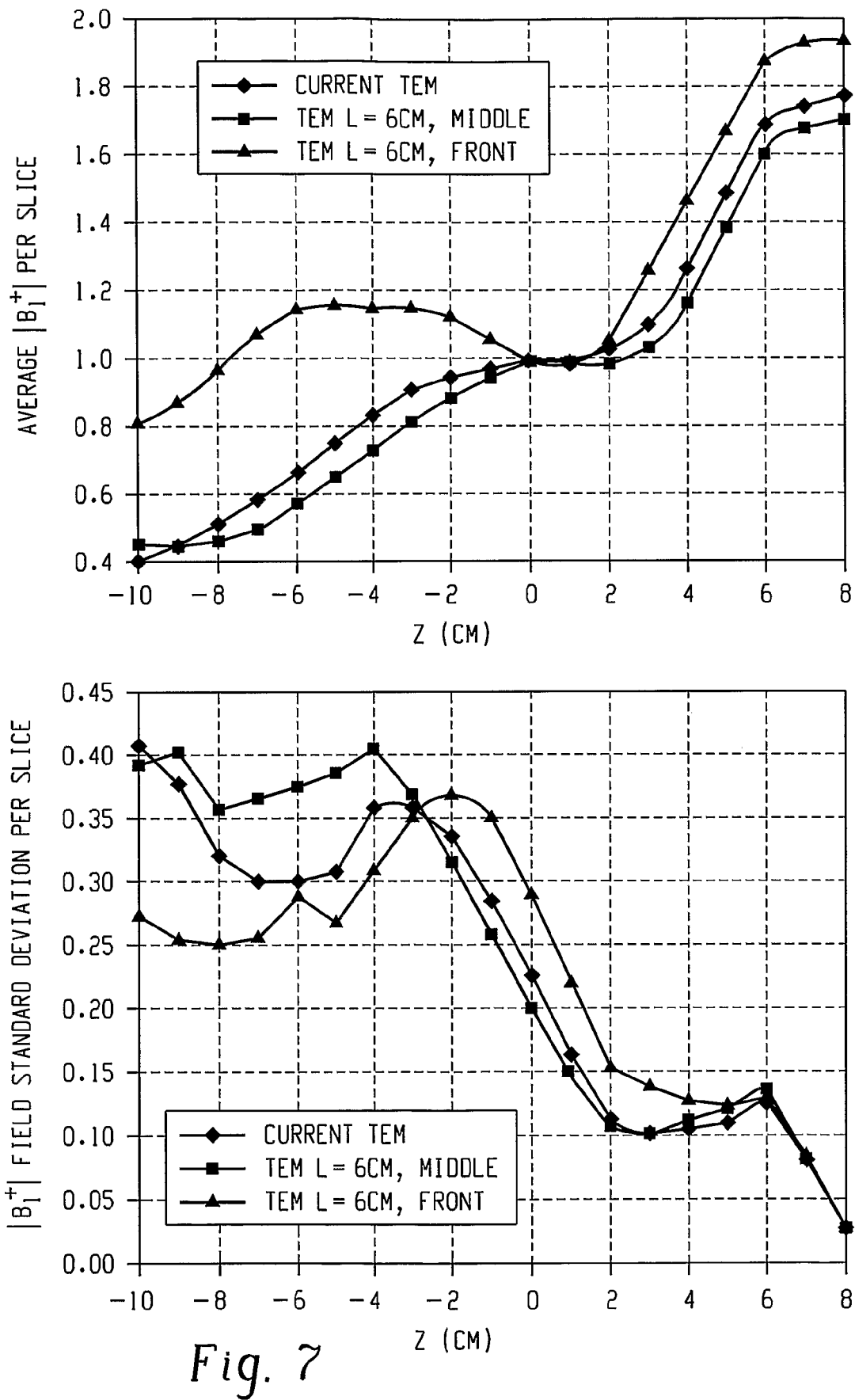

FIG. 7 shows a plot of average B1 per slice and B1 standard deviation for three TEM coils.

Figure 8:
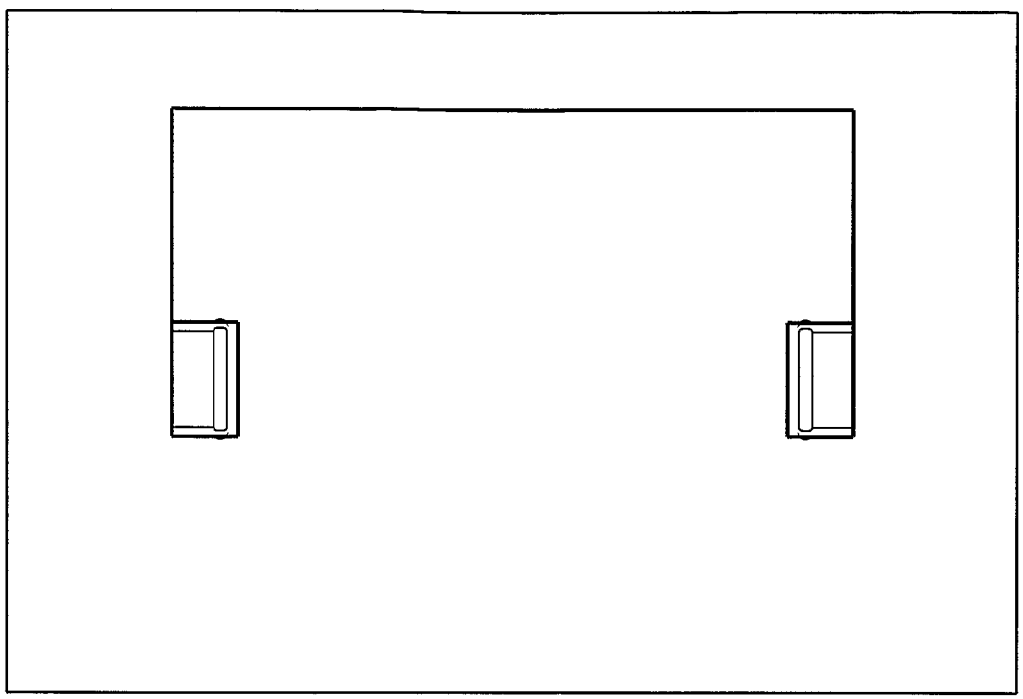

FIG. 8 shows an embodiment of a TEM coil in which TEM resonators are disposed at an open end of the coil.

Figure 9:
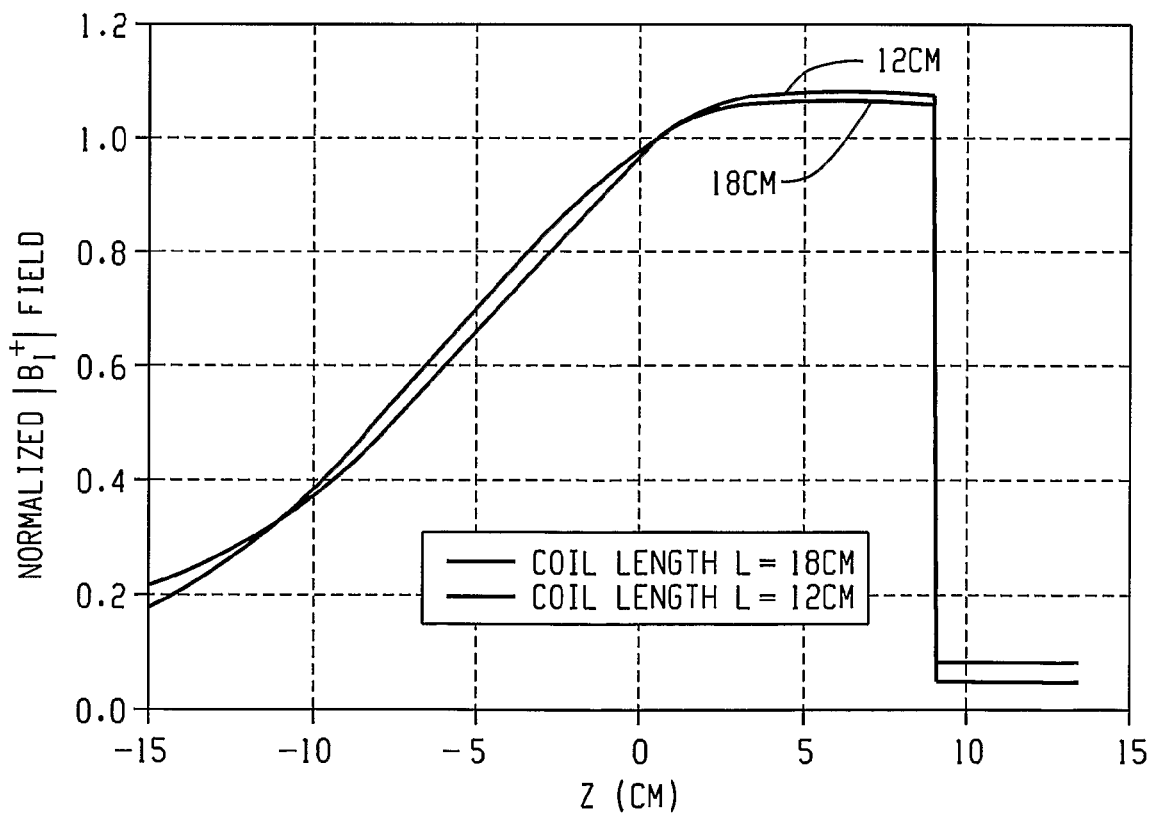

FIG. 9 shows a plot of B1 field for two TEM coils.

Figure 10A:
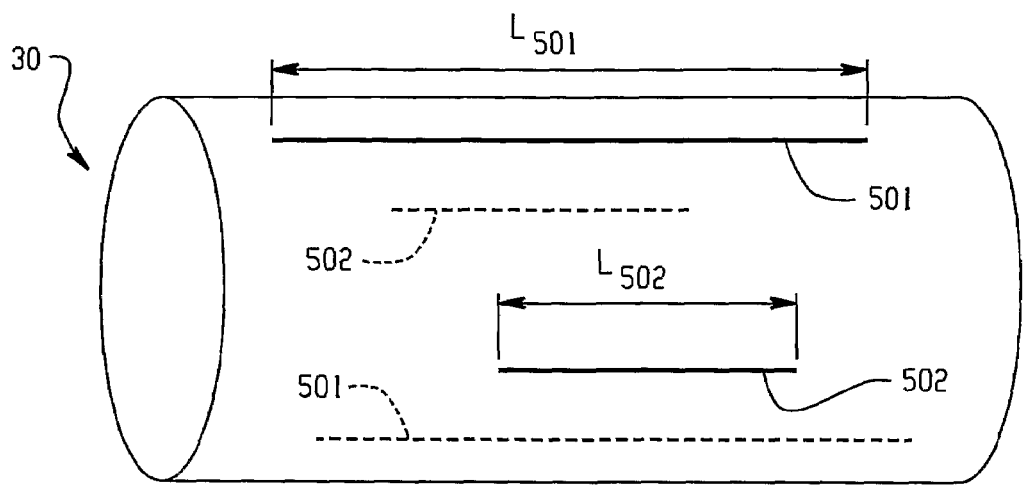

FIG. 10A shows a perspective view of an embodiment of a TEM coil with resonator elements of varying length.

Figure 10B:
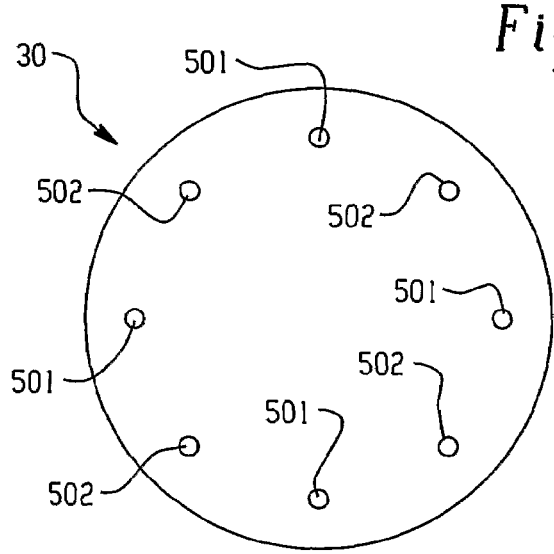

FIG. 10B shows an axial view of an embodiment of a TEM coil with resonator elements of varying length.

Figure 10C:
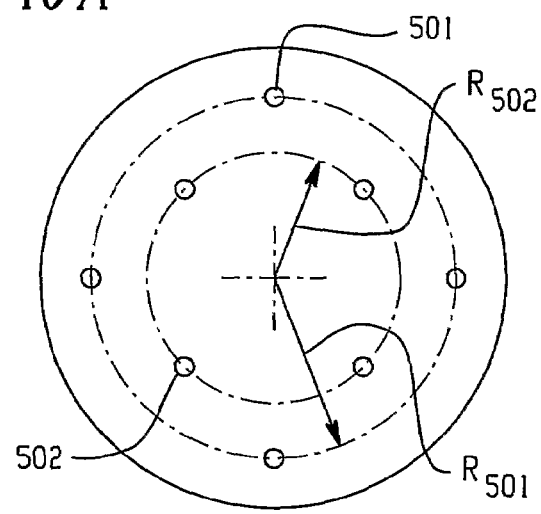

FIG. 10C shows an axial view of an embodiment of a TEM coil with resonator elements disposed at varying radial positions.

Figure 11:
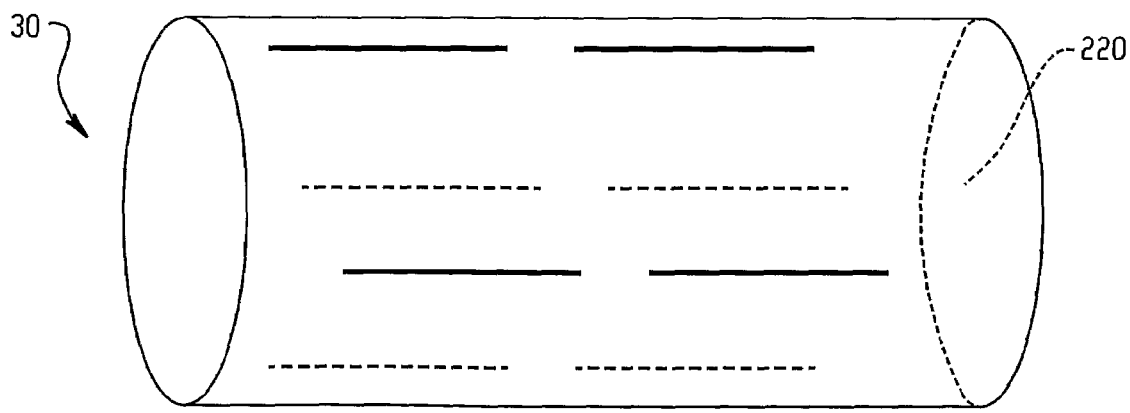

FIG. 11 shows an embodiment of a TEM coil with resonator elements disposed at varying axial positions.

Figure 1:
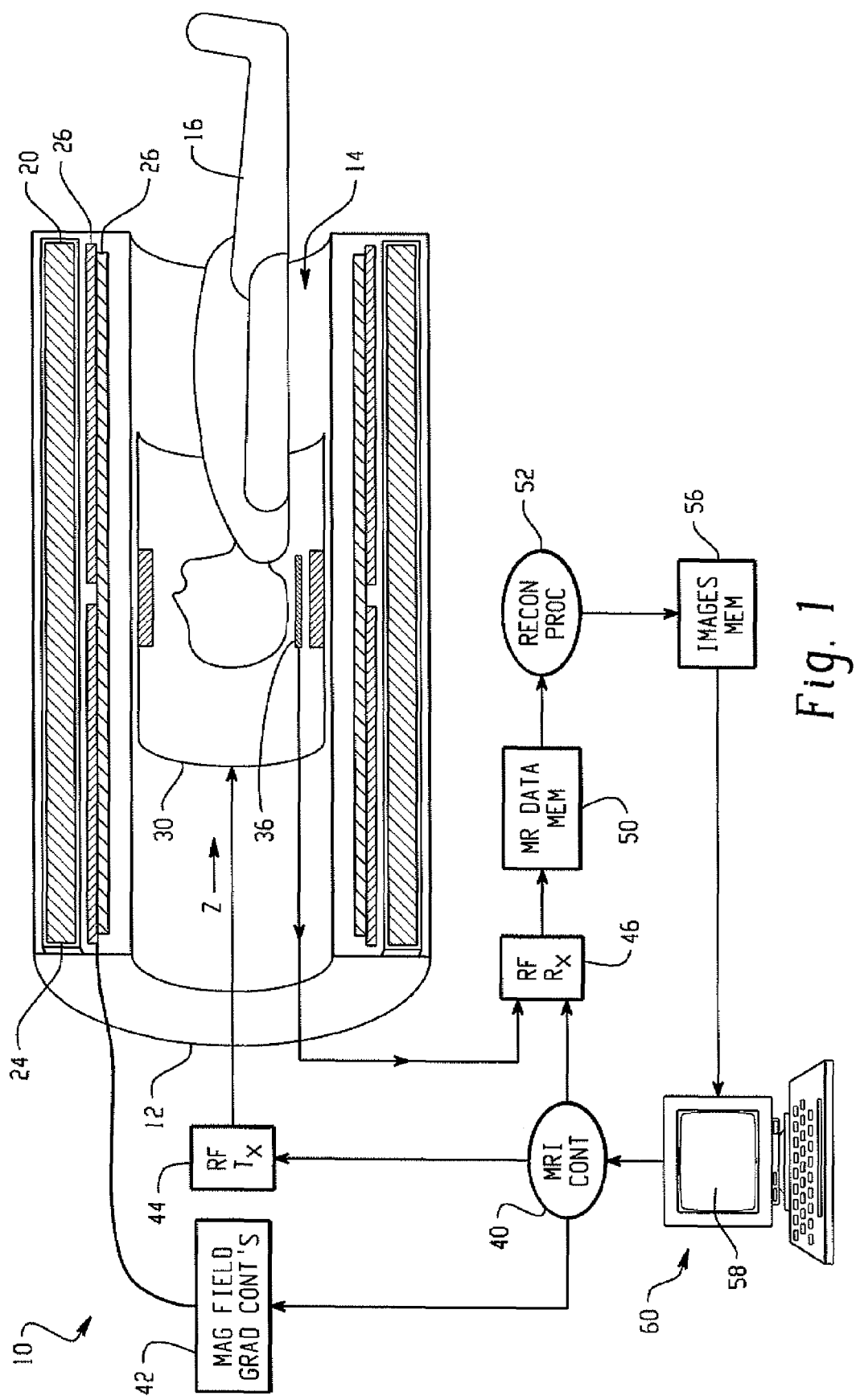

With reference to FIG. 1, a magnetic resonance imaging scanner 10 includes a housing 12 defining a generally cylindrical scanner bore 14 inside of which an associated imaging subject 16 is disposed. Main magnetic field coils 20 are disposed inside the housing 12, and produce a substantially spatially and temporally constant $B_0$ magnetic field, directed generally along a z-direction within an imaging region contained in the scanner bore 14. $B_0$ fields on the order of 3T to 7T are contemplated, but fields higher than 7T and as low as a fraction of a Tesla are also contemplated. Typically, the main magnetic field coils are superconducting coils disposed inside of cryoshrouding 24. However, resistive main magnetic field coils can also be employed.

The housing 12 also houses or supports magnetic field gradient-generating structures, such as magnetic field gradient coils 26, for selectively producing magnetic field gradients parallel to the z-direction, transverse to the z-direction, or along other selected directions. The housing 12 further houses or otherwise supports a first radio frequency coil 30 for selectively exciting magnetic resonances. Specifically, the radio frequency coil 30 produces a radio frequency $B_1$ magnetic field transverse to the main $B_0$ magnetic field. The radio frequency $B_1$ magnetic field is generated at the Larmor frequency for exciting a nuclear magnetic resonance. For proton imaging at 7T, a $B_1$ frequency of about 298 MHz is suitable, while at 3T a $B_1$ frequency of about 128 MHz is suitable. In the illustrated embodiment, the coil 30 is a transverse electromagnetic (TEM) coil. Also shown in FIG. 1 is a second radio frequency coil 36 which is disposed within the TEM coil. In this embodiment the second radio frequency coil is shown as a single surface coil. However, other types of coils, such as volume, quadrature, coil arrays, and the like are also contemplated.

During imaging, the main magnetic field coils 20 produce the spatially and temporally constant $B_0$ magnetic field parallel to the z-direction in the bore 14 within the imaging region. A magnetic resonance imaging controller 40 operates magnetic field gradient controllers 42 to selectively energize the magnetic field gradient coils 26, and operates a radio frequency transmitter 44 coupled to the radio frequency coil 30 to selectively energize the radio frequency coil 30. By selectively operating the magnetic field gradient coils 26 and the radio frequency coil 30, magnetic resonance is generated and spatially encoded in at least a portion of the region of interest of the imaging subject 16. By applying selected magnetic field gradients via the gradient coils 26, a selected k-space trajectory is traversed during acquisition of magnetic resonance signals, such as a Cartesian trajectory, a plurality of radial trajectories, or a spiral trajectory. A radio frequency receiver 46, coupled with the second radio frequency coil 36, receives magnetic resonance samples during traversal of the k-space trajectory. The samples are stored in a magnetic resonance data memory 50.

The magnetic resonance data are reconstructed by a reconstruction processor 52 into one or more reconstructed images. In the case of k-space sampling data, a Fourier transform-based reconstruction algorithm can be employed. Other reconstruction algorithms, such as a filtered backprojection-based reconstruction, may also be used depending upon the format of the acquired magnetic resonance imaging data. The reconstructed image or images generated by the reconstruction processor 52 are stored in an images memory 56, and can be displayed on a display 58 of a user interface 60, stored in non-volatile memory, transmitted over a local intranet or the Internet, viewed, stored, manipulated, or so forth. The user interface 60 can also enable a radiologist, technician, or other operator of the magnetic resonance imaging scanner 10 to communicate with the magnetic resonance imaging controller 40 to select, modify, and execute magnetic resonance imaging sequences.

The described magnetic resonance imaging system is an example. The radio frequency coils described herein can be employed with substantially any type of magnetic resonance imaging scanner, such as an open magnet scanner, a vertical magnet scanner, or so forth. Moreover, the radio frequency coils described herein can be employed in magnetic resonance procedures other than imaging, such as in magnetic resonance spectroscopy.

Figure 2A:
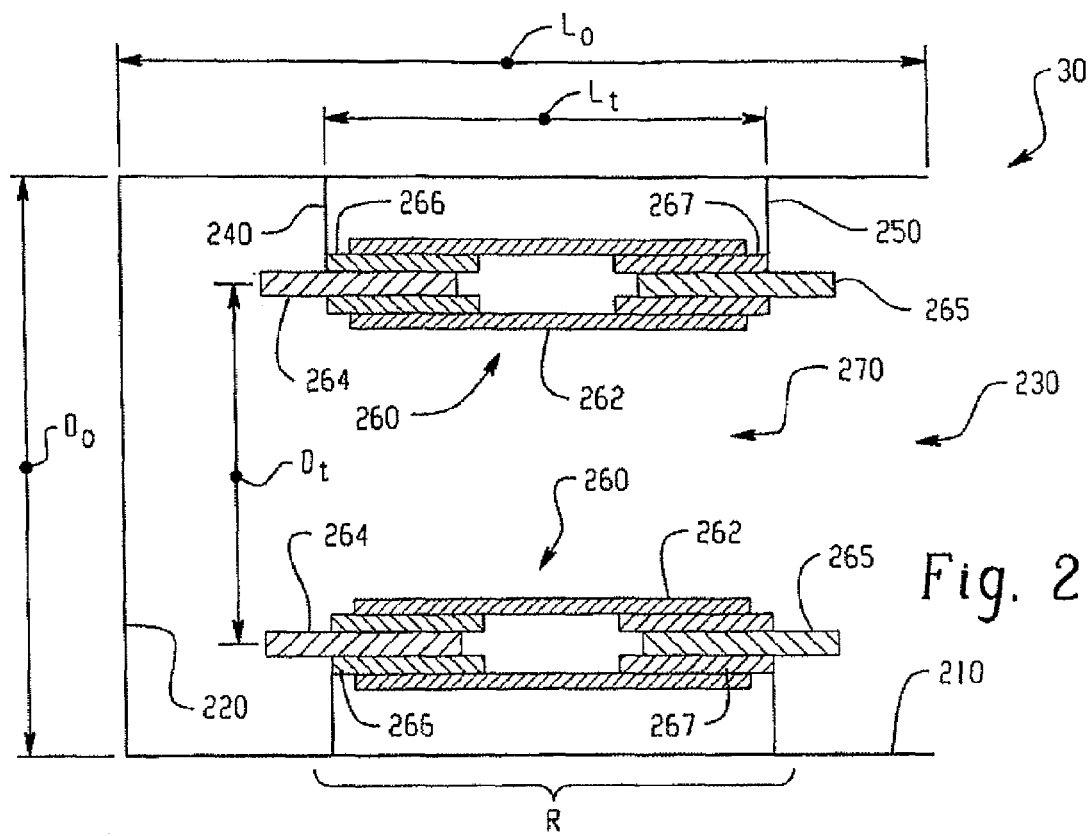
FIG. 2B shows a perspective view of a TEM coil.
Figure 2B:
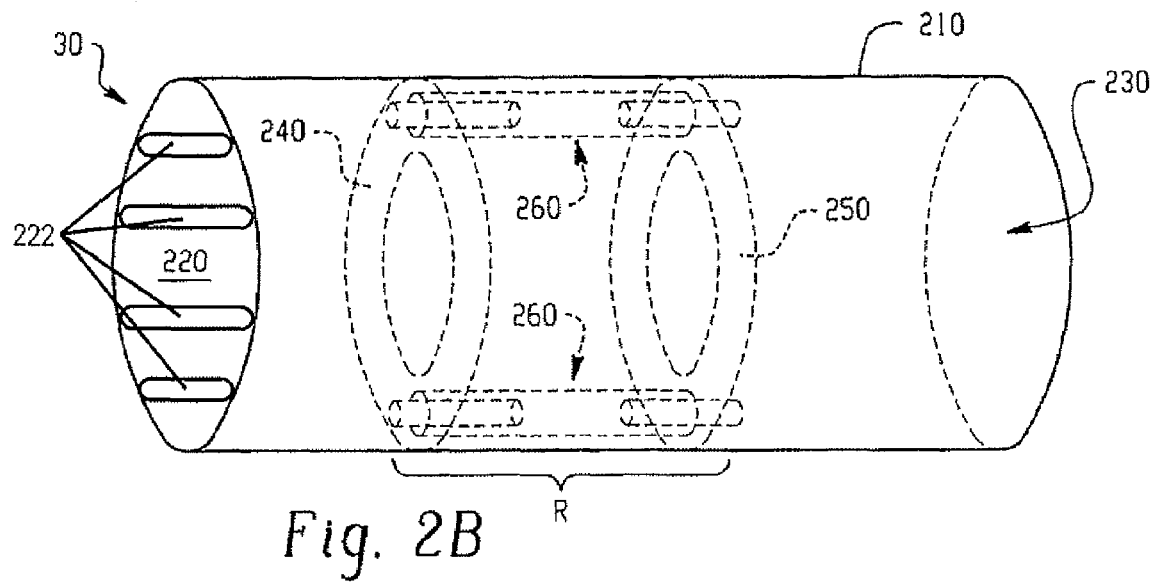

Turning to FIGS. 2A-2B, an embodiment of the TEM resonator 30 is shown in greater detail. In this embodiment, a half closed ultra-short TEM based transmit head coil is shown. A feature of this kind of TEM coil is that, the actual coil elements are much shorter than the coil itself. In practical applications, an even number of elements (e.g., 16) are used, but only two elements are shown in the figure to simplify the illustration.

As shown in FIGS. 2A-2B, the TEM coil includes an electrically conductive cylindrical shell 210 and an electrically conductive end plate 220 disposed at a first end of the coil. The cylindrical shell has a length $L_O$ and a diameter $D_O$. In the embodiment shown, the end plate can be a slotted plate, having slots 222, which closes the coil at the first end. Slots 222 in the end plate may be bridged with capacitors (not shown). Together, the cylinder and the end plate form a TEM shield and define a cavity 230 having an opening at a second end of the coil, opposite the first end.

Disposed within the cavity of the TEM coil are first and second inner plates 240, 250 and a plurality of TEM elements 260. In the embodiment shown, the first and second inner plates are disposed apart from each other by a distance $L_T$ in a central region R of the cylindrical shell. As can be seen, the distance $L_T$, which also represents the functional length of the TEM elements, is less than the length $L_O$ of the cylindrical shell. Further, the first and second inner plates each include an aperture. The apertures, along with the TEM elements, define an inner bore 270 of the TEM coil. Accordingly, the apertures in the inner plates permit a region of interest of the subject 16 to be positioned within the inner bore of the TEM coil.

Figure 3:
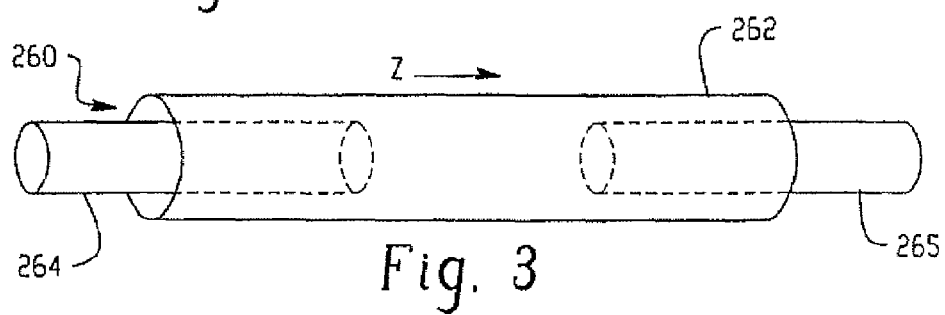
FIG. 3 shows a perspective view of a resonator element.

As shown in FIGS. 2A-2B and FIG. 3, each TEM element 260 includes an outer tube 262 and first and second inner rods 264, 265 disposed within the outer tube and held radially in place within the tube by dielectric sleeves 266, 267 (not shown in FIG. 3). The TEM elements are disposed around the inner bore a form a generally circular pattern having a diameter $D_T$ defined by the centers of the TEM elements. Further, the outer tubes are separated from the inner plates by short gaps in the axial direction. This provides substantial electrical isolation between the tubes and the inner plates. With respect to the inner rods, these center conductors make electrical contact with their respective inner plates and do not extend the full length of the tubes. Rather, the insertion depth of the inner conductors can be adjusted in a z-direction. As such, they include open-circuited transmission lines of variable length which can be adjusted to tune the elements as desired.

In another embodiment, shown in FIGS. 4A and 4B, the TEM resonator 30 includes multiple longitudinal conductors arranged in a cylindrical pattern and enclosed by cylindrical shield. In the embodiment shown, rather than the tube and rod structure described above, the longitudinal conductors are conducting strip or microstrip conductors 462. Moreover, the conducting strips or inner conductors of microstrips connect to the shield via capacitors. A hollow cylindrical coil former made of dielectric material could be used to form the microstrip structure. In this embodiment, the inner microstrip conductors are capacitively coupled to the TEM shield and fine tuning of the coil is performed via the capacitors 470. Again, the TEM elements are shorter than the cylindrical shell of the TEM coil.

With more specific regard to the dimensions of the TEM coil 30, in one embodiment, a head coil with relatively short TEM resonant elements is provided. The coil is much larger than conventional head coils while maintaining very good $B_1$-field uniformity and limited SAR. While reference is made to a head coil, it is to be understood that the end plate of the TEM coil limits the use of the coil to applications in which it is not necessary for the subject to extend through the center of the coil beyond both ends. Accordingly, the coil is not limited to uses associated with a subject's head. For example, other extremities, such as hands and feet can also be imaged using the coil.

In the present embodiment the TEM coil includes relatively short TEM elements compared to the length of the associated TEM shield. In addition, this embodiment included an end plate which helps contain the E and B fields. It reduces the radiation losses to that side of the coil as well as reduces coupling to the associated electrical connectors. Accordingly, in this embodiment, the radio-frequency coil is a closed end TEM coil with relatively short TEM elements.

More specifically, in one embodiment the TEM coil includes 16 radiating elements. Each element is 10 cm long ($L_T$=10 cm) and the inner bore is 60.6 cm in diameter ($D_T$=60.6 cm). The associated TEM shield is 40 cm long ($L_O$=40 cm) and 68 cm in diameter ($D_O$=68).

For demonstration purpose, this coil is modelled at 7 tesla using an FDTD approach using the above referenced dimensions. Accordingly, the model coil is based on a 16-element lumped capacitor TEM resonator structure disposed inside a 68 cm-diameter RF shield. As described above, one side of the TEM coil is closed by an end plate. Comparison is made between this TEM coil embodiment and a standard TEM head coil, having equal shield and TEM element lengths of 18 cm and a diameter defined by the TEM elements of 30 cm.

FIG. 5 shows a normalized $|B_1^+|$-field comparison between the present embodiment of the TEM coil (curve labelled 'new head coil') and the standard sized TEM head coil (curve labelled 'Head TEM 7T'). $B_1^+$-field along the z-axis is substantially uniform over a large region, as shown in FIG. 5. With respect to the standard TEM head coil at 7T, the $B_1$-field in the head associated with the present embodiment is very comparable, as shown in FIG. 5. But here, an advantage of the present embodiment is that the coil is more open than the standard coil. This is due to the fact that it is approximately twice as long and approximately twice as large in diameter as the standard TEM head coil.

Another design consideration related to the present TEM coil embodiment is SAR. In accordance with the above model parameters, a SAR comparison is made between the present embodiment and the standard head TEM coil. The average $B_1^+$-field in the same transverse slice of the head is equal for the two cases. The calculated SAR is shown in Table 1 which includes a 100% duty cycle SAR comparison between the new TEM resonant elements based large-sized transmit head coil and standard 7T TEM head coil. SAR is scaled to have average $|B_1^+|$-field equal to 10 µT in the same central transverse slice of the head model. It is seen that, for the new head coil, head SAR and local SAR is lower than for the standard TEM head coil. Input RF power is about the same between the coils.

TABLE 1

| 100% Duty-cycle | Head SAR (W/kg) | Maximum 10 g Local-SAR (W/kg) | Input power (kW) |
|---|---|---|---|
| New head coil | 88 | 346 | 1.1 |
| Standard TEM 7T head coil | 114 | 415 | 1.2 |
| Change % | −23% | −17% | −8% |

In another embodiment, the overall dimensions of the TEM coil can be similar to those of the standard head TEM coil. In comparison to the standard coil, this embodiment can be made with improved coverage or it can be made shorter with similar coverage.

In one embodiment, the overall length ($L_O$) of the TEM coil is 18 cm. The diameter ($D_T$) associated with the TEM elements is 30 cm and the length ($L_T$) of the TEM elements is 6 cm. As shown in FIGS. 6A and 6B, two head coils with 6 mm long TEM elements that otherwise have the same dimensions as that of the standard TEM head coil. As shown in embodiment of FIG. 6A, the TEM elements can be disposed in a central region of the cylindrical shell. As shown in the embodiment of FIG. 6B, the TEM elements can be placed at the open end of the cylindrical shell.

FIG. 7 shows $B_1$-field in transverse slices for current TEM head coil and two short TEM element based on the embodiments shown in FIGS. 6A and 6B. Specifically, FIG. 7 shows a comparison of the average $|B_1^+|$-field per transverse slice of the head and its standard deviation for two head coils and the standard 7T TEM head coil. The plot of average $|B_1^+|$-field per transverse slice and its standard deviation in FIG. 7 shows advantages of the short element head coil embodiments.

When the TEM elements are placed in the central region of the cylindrical shell, the loaded $|B_1^+|$-field per slice and standard deviation is almost the same as those of the standard TEM head coil with full length elements. This indicates that the two coils have substantially equal performance of $B_1^+$-field uniformity.

Referring to FIG. 6B and FIG. 7, when the TEM elements are placed near the second (front or open) end of the cylindrical shell, the axial uniformity of the loaded $|B_1^+|$-field substantially improved compared to the standard TEM head coil with full length elements. This facilitates a larger field of view of use for the improved coil as compared to the standard TEM coil.

FIG. 8 shows an embodiment in which $L_O$=12 cm and the TEM elements are disposed at the open end of the cylindrical shell. In effect, such an embodiment is similar to the embodiment described above where $L_O$=18 cm and the TEM elements are disposed in the central region of the cylindrical shell. The difference between the two embodiments is that the portion of the cylindrical shell which extends from the TEM elements to the open end of the 18 cm coil has been removed. As can be seen in FIG. 9, removing this front portion of the shield does not affect $|B_1^+|$-field in the shorter TEM element based head coil. Thus effectively a head coil can be made even shorter without compromising the $|B_1^+|$-field uniformity coverage along the z-axis. A shorter head coil may look more open to the patient and improves his comfort level.

On the other hand, if the coil length is kept the same and the TEM elements are disposed in open end (or front) of the coil, as shown in FIG. 6B, a larger field of view in the axial direction can be achieved.

For the shorter TEM element head coils in FIGS. 6A and 6B, SAR is larger than with the full length TEM element head coil due to reduced coil sensitivity and the proximity effect, as shown in Table. 2. Comparing the new coil in FIG. 6A with the standard TEM 7T head coil, head SAR only increases 8%, and local SAR increase 5%. However, in a case where the head coil is placed far away from the shoulders, it has lower head and local SAR while maintaining good $B_1^+$-field uniformity in the brain region.

TABLE 2

| 100% Duty-cycle | Head SAR (W/kg) | Maximum 10 g Local-SAR (W/kg) | Input power (kW) |
|---|---|---|---|
| Standard TEM 7T head coil | 114 | 415 | 1.2 |
| New TEM elements in the middle | 123 | 434 | 1.4 |
| New TEM elements in the middle, front part of RF shield is removed | 128 | 470 | 1.6 |
| New TEM elements in the open front and placed near the neck | 201 | 885 | 2.8 |
| New TEM elements in the open front and placed near the brain | 115 | 479 | 1.5 |

In yet another embodiment, the TEM coil includes TEM elements of varying length with respect to each other. In the embodiment shown in FIGS. 10A and B, the TEM coil 30 includes first TEM elements 501 having a length $L_{501}$ and second TEM elements 502, having a length $L_{502}$. In this embodiment, the length of the elements can be selected as desired provided that at least one of the lengths is less than the length of the TEM shell. In the embodiment shown in FIG. 10A, two elements having length $L_{501}$ are shown opposite one another, while two elements having length $L_{502}$ are shown opposite one another. It is to be understood that, as shown in FIG. 10B, various numbers of elements can be disposed within the TEM coil. As can be seen in FIG. 10B, the elements are spaced symmetrically within the coil. Further, switching between the first and second TEM elements in either transmit or receive modes can be accomplished using, for example PIN diode switches, as desired.

As shown in FIG. 10B, the first and second TEM elements are each disposed at the same radial position. However, in an embodiment shown in FIG. 10C, the first TEM elements 501 are disposed at a first radial distance $R_{501}$ from the center of the coil shell, while the second TEM elements 502 are disposed at a second radial distance $R_{502}$ from the center of the shell.

In still another embodiment, resonator elements can be disposed within the shell of the TEM coil at first and second axial positions. With specific reference to FIG. 11, TEM elements are shown disposed in proximity to the end of the coil opposite the end plate 220 as well as in a central region of the TEM coil. The two sets of TEM elements in this embodiment can be used together in transmit and/or receive mode. Alternately, the TEM elements can be used independently in transmit and/or receive mode on the basis of their axial position. In such an embodiment, switching between the TEM elements can be accomplished via PIN diode switches.

In operation, it is to be understood that the TEM elements described above can be utilized as a group or can be utilized individually as desired. In a multi-transmit or multi-receive embodiment, the MR scanner includes multiple, independent RF chains for each multi-channel element. These paths can be configured individually for either transmission or reception of RF signals. As a consequence it is possible to use one or more channels for RF transmission and one or more for RF reception.

For example, in one embodiment N independent RF waveforms are amplified by the amplifier and routed via transmit/receive switches to the TEM coil. Each of these switches is controlled individually so that any combination of simultaneous transmit and receive is possible. In conventional receive mode the data are routed to the receive channels for digitalization and further processing.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A transverse electromagnetic (TEM) coil comprising:
   an electrically conductive shell;
   an electrically conductive end plate disposed at a first end of the shell which closes the coil at the first end; and
   a plurality of TEM elements disposed within the shell, the plurality of TEM elements being shorter than the shell, the TEM elements being disposed at a first axial position, wherein the first axial position is the second end of the shell opposite the first end.

2. A TEM coil as set forth in claim 1 wherein the plurality of TEM elements define an inner bore having a diameter substantially larger than 30 cm.

3. A TEM coil as set forth in claim 1 wherein the plurality of TEM elements define an inner bore having a diameter which is approximately 60 cm.

4. A TEM coil as set forth in claim 1 wherein the TEM coil has an overall length substantially defined by the shell and the TEM elements have a length which is substantially less than the overall length of the TEM coil.

5. A TEM coil as set forth in claim 1 wherein the TEM coil has an overall length substantially defined by the shell and the TEM elements have a length which is approximately twenty-five percent of the overall length of the TEM coil.

6. A TEM coil as set forth in claim 1 further comprising a second plurality of TEM elements disposed within the shell at a second axial position which is different from the first axial position.

7. A TEM coil as set forth in claim 1 wherein the TEM elements transmit and/or receive electromagnetic fields independently from one another.

8. A magnet resonance apparatus comprising:
   a main magnet for generating a main magnetic field in an examination region;
   a plurality of gradient coils for generating magnetic gradient fields in conjunction with the main magnetic field; and
   a RF transmit coil comprising a transverse electromagnetic (TEM) coil as set forth in claim 1 for transmitting RF pulses into the examination region.

9. A transverse electromagnetic (TEM) coil comprising:
   an electrically conductive shell;
   a first plurality of TEM elements having a first length disposed within the shell;
   a second plurality of TEM elements having a second length disposed within the conductive shell, wherein the first and second lengths are not equal to one another; and
   an end plate disposed at a first end of the conductive shell.

10. A TEM coil as set forth in claim 9 wherein the first plurality of TEM elements are disposed at a first radial distance from the center of the shell and the second plurality of TEM elements are disposed at a second radial distance from the center of the shell and the first and second radial distances are not equal to one another.

11. A TEM coil as set forth in claim 9 wherein each element of the first and second pluralities of TEM elements transmits and/or receives electromagnetic fields independently from one another.

12. A magnet resonance apparatus comprising:
a main magnet for generating a main magnetic field in an examination region;
a plurality of gradient coils for generating magnetic gradient fields in conjunction with the main magnetic field; and
a RF transmit coil comprising a transverse electromagnetic (TEM) coil as set forth in claim 9 for transmitting RF pulses into the examination region.

13. A transverse electromagnetic (TEM) coil comprising;
an electrically conductive shell;
an electrically conductive end plate disposed at a first end of the shell, the end plate being a slotted plate which closes the coil at the first end; and
a plurality of TEM elements disposed within the shell, the plurality of TEM elements being shorter than the shell.

14. A TEM coil as set forth in claim 13 wherein the TEM elements are disposed in a central region of the shell.

15. A magnet resonance apparatus comprising:
a main magnet for generating a main magnetic field in an examination region;
a plurality of gradient coils for generating magnetic gradient fields in conjunction with the main magnetic field; and
a RF transmit coil comprising a transverse electromagnetic (TEM) coil as set forth in claim 13 for transmitting RF pulses into the examination region.

16. A TEM coil as set forth in claim 13 wherein the plurality of TEM elements define an inner bore having a diameter substantially larger than 30 cm.

17. A TEM coil as set forth in claim 13 wherein the plurality of TEM elements define an inner bore having a diameter which is approximately 60 cm.

18. A TEM coil as set forth in claim 13 wherein the TEM coil has an overall length substantially defined by the shell and the TEM elements have a length which is substantially less than the overall length of the TEM coil.

19. A TEM coil as set forth in claim 13 wherein the TEM coil has an overall length substantially defined by the shell and the TEM elements have a length which is approximately twenty-five percent of the overall length of the TEM coil.

20. A TEM coil as set forth in claim 13 wherein the TEM elements transmit and/or receive electromagnetic fields independently from one another.

* * * * *